(12) United States Patent
Takahashi

(10) Patent No.: US 6,995,049 B2
(45) Date of Patent: Feb. 7, 2006

(54) METHOD FOR FORMING SEMICONDUCTOR DEVICE

(75) Inventor: Akira Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/445,859

(22) Filed: May 28, 2003

(65) Prior Publication Data

US 2004/0106247 A1    Jun. 3, 2004

Related U.S. Application Data

(62) Division of application No. 09/962,190, filed on Sep. 26, 2001, now Pat. No. 6,632,710.

(30) Foreign Application Priority Data

Oct. 12, 2000 (JP) .............................. 2000-312351
Apr. 17, 2001 (JP) .............................. 2001-118227

(51) Int. Cl.
    *H01L 21/00* (2006.01)
    *H01L 21/84* (2006.01)
(52) U.S. Cl. ...................................... 438/149; 438/153
(58) Field of Classification Search ................ 438/149, 438/151, 153–154, 161, 164, 404
See application file for complete search history.

(56) References Cited

U.S. PATENT DOCUMENTS

| | | | | |
|---|---|---|---|---|
| 5,914,510 A | * | 6/1999 | Hieda | 257/301 |
| 6,060,738 A | * | 5/2000 | Hidaka et al. | 257/306 |
| 6,133,610 A | * | 10/2000 | Bolam et al. | 257/349 |
| 6,632,710 B2 | * | 10/2003 | Takahashi | 438/149 |

* cited by examiner

*Primary Examiner*—Phat X. Cao
*Assistant Examiner*—Theresa T. Doan
(74) *Attorney, Agent, or Firm*—Volentine Francos & Whitt, PLLC

(57) ABSTRACT

In a method for forming a silicon-on-insulator FET having a contact that provides a fixed potential to a substrate, the substrate-biasing between the SOI transistor and the silicon substrate is performed via a plug. As a result, a contact hole for the substrate-biasing does not need to pass through the insulating layer, the silicon layer, and the interlayer insulating layer of the structure. Therefore, the interlayer insulating layer can be made to have shallow depth. Ions can thus be implanted to the surface of the substrate via the contact hole for substrate-biasing. The contact hole for substrate-biasing can be formed without causing an opening fault.

4 Claims, 13 Drawing Sheets

METHOD FOR FORMING SEMICONDUCTOR DEVICE

CROSS REFERENCE TO RELATED APPLICATIONS

This is a divisional application of application Ser. No. 09/962,190, filed Sep. 26, 2001 now U.S. Pat. No. 6,632,710, which is hereby incorporated by reference in its entirety for all purposes.

BACKGROUND OF THE INVENTION

1. Field of the Invention

The present invention generally relates to a method for forming a silicon-on insulator FET, and more particularly, the present invention relates to the method for forming a silicon-on-insulator FET providing a contact to be given a fixed potential to a substrate reduction of contact resistance on a substrate having a SOI layer isolated with an insulating layer.

This application is counterparts of Japanese application Serial Number 312351/2000, filed Oct. 12, 2000 and Japanese application Serial Number 118227/2001, filed Apr. 17, 2001, the subject matter of which is incorporated herein by reference.

2. Description of the Related Art

The conventional SOI FETs have a "floating body" in which the body of the FET is located on insulating layer and not electrically connected to a fixed potential. Floating body SOI devices can experience high leakage current and parasitic bipolar action. This disadvantage can be eliminated by providing a contact to the substrate to tie the body to a fixed potential.

In conventional arts, a method for forming a silicon-on-insulator FET providing a contact to be given a fixed potential to a substrate, which is the following.

A silicon-on insulator (SOI) transistor includes transistor region formed in a silicon layer on a substrate via an insulating layer. An interlayer insulating layer overlies the SOI transistor. The SOI transistor includes a conductive contact layer which extends through the interlayer insulating layer, the silicon layer, and the insulating layer. The conductive contact layer fills with a contact hole which is formed by etching the interlayer insulating layer, the silicon layer, and the insulating layer so as to expose a surface of the substrate. The exposed surface of the substrate is implanted ions via the contact hale because of decreasing a contact resistance.

The conventional SOI transistor has a performance disadvantage. Since the contact hole is formed by etching the interlayer insulating layer, the silicon layer and the insulating layer so as to expose a surface of the substrate, it is deep. As a result, a deep contact hole is a high aspect ratio. The ion-implantation to the surface of the substrate via the contact hole is hardly performed. The variation shape of the contact hole contributes to the variation of the contact variation. The contact hole for substrate-biasing is deeper than contact holes of a source, a drain, and a gate in the SOI transistor. If these contact holes are simultaneously formed each of portions, the contact hole for substrate-biasing causes an opening fault because of it is deep contact hole.

SUMMARY OF THE INVENTION

An object of the present invention is to provide a method for forming a silicon-on-insulator FET that can be enough to be implanted ions to the surface of the substrate via the contact hole for substrate-biasing. It can form the contact hole for substrate-biasing without the contact hole for substrate-biasing causes an opening fault.

According to one aspect of the present invention, for achieving the above object, there is provided a method for forming a silicon-on-insulator FET providing a contact to be given a fixed potential to a substrate, the method comprising: providing a semiconductor substrate having an insulating layer; forming a silicon layer on the insulating layer; forming a first conductive contact layer extending through the silicon layer and the insulating layer, the first conductive contact layer electrically connected to the substrate; forming an interlayer-insulating layer overlying the silicon layer; forming a through-hole in the interlayer-insulating layer, the through-hole forming so as to correspond to the first conductive contact layer; and filling a second conductive contact layer in the through-hole.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A method for forming a silicon-on-insulator FET according to a first preferred embodiment of the present invention will hereinafter be described in detail with reference to the accompanying drawings.

FIG. 1A–FIG. 1I are cross-sectional views showing a method for forming a silicon-on-insulator FET according to a first preferred embodiment of a present invention.

Figure 1A:
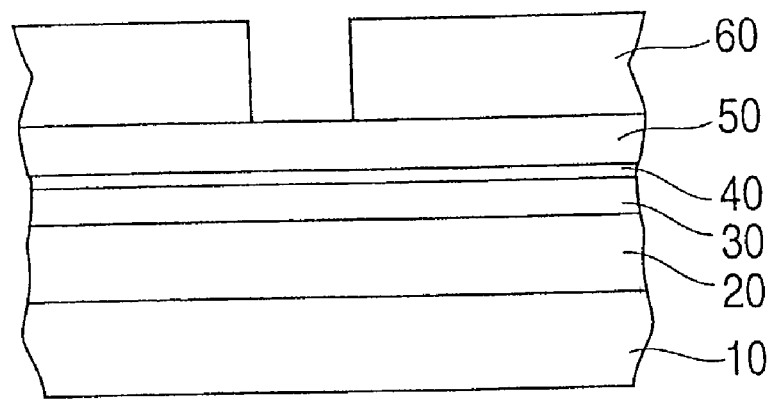
FIG. 1A–FIG. 1I are cross-sectional views showing a method for forming a silicon-on-insulator FET according to a first preferred embodiment of a present invention.

As shown in FIG. 1A, a silicon-on-insulator (SOI) structure is provided. Examples of the methods to form the SOI structure are called SIMOX (separation by implantation of oxygen) or a bonded wafer. The SOI structure is made up of a silicon substrate 10, an insulating layer 20, and a silicon layer 30. Then, a silicon oxide film 40 and a silicon nitride layer 50 are sequentially formed on the silicon layer 30. Then, a first resist pattern 60 is overlaid the silicon nitride layer 50. The first resist pattern 60 has an opening corresponded to a portion which is formed a contact hole for a substrate-biasing. The first resist pattern 60 has another openings corresponded to each of portions which is formed isolating portion between active region (transistor region) in the silicon layer 30 (not shown).

Figure 1B:
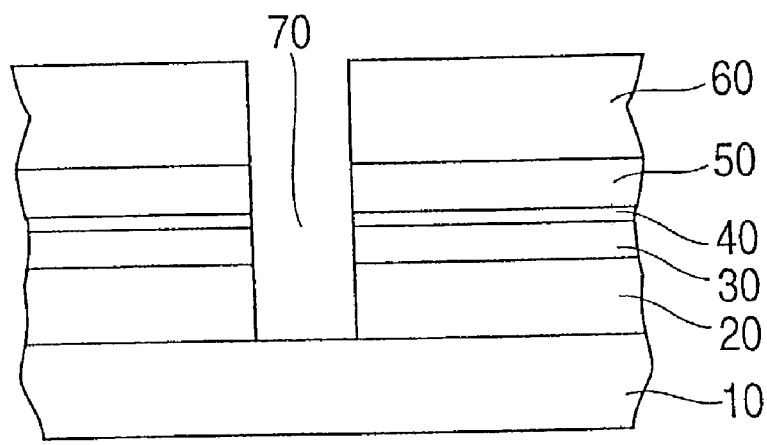

As shown in FIG. 1B, the silicon nitride layer 50, the silicon oxide film 40, the silicon layer 30, and the insulating layer 20 are etched using the first resist pattern 60 as an etching mask. As a result, a first contact hole 70 for a substrate-biasing is formed so as to pass through the silicon nitride layer 50, the silicon oxide film 40, the silicon layer 30, and the insulating layer 20. Then, the first resist pattern 60 is removed.

Figure 1C:
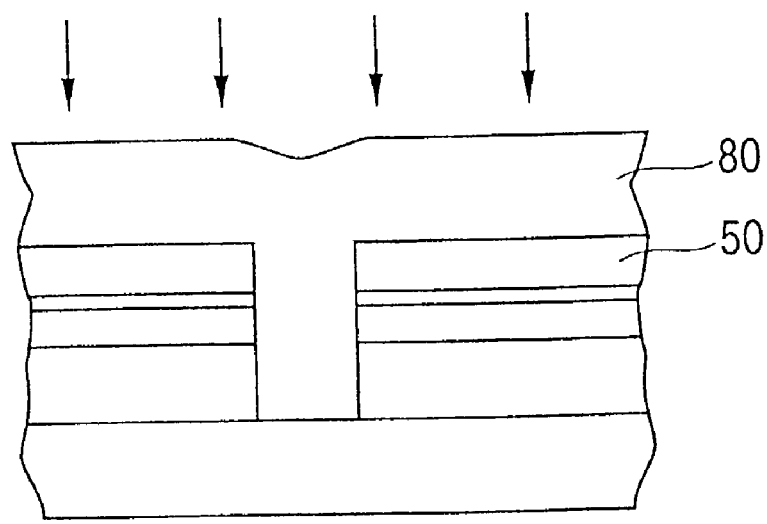

As shown in FIG. 1C, a polycrystalline silicon layer 80 is formed so as to fill with the first contact hole 70 and overlie the silicon nitride layer 50. The polycrystalline silicon layer 80 is obtained a low-resistance of the contact by implanting ions. The ions are also diffused in a portion of the silicon substrate for the substrate-biasing by annealing. Therefore, a diffused region in the silicon substrate 10 formed by processes of the ion-implantation and the annealing, which can decrease the contact resistance for the substrate-biasing.

The diffused region may be formed by implanting ions in the first contact hole 70 and by annealing.

Figure 1D:
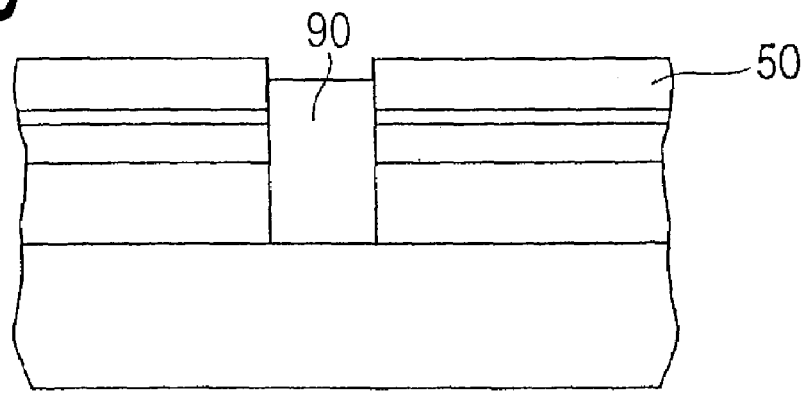

As shown in FIG. 1D, the polycrystalline silicon layer 80 is polished till a surface of the silicon nitride layer 50 exposes using CMP (Chemical Mechanical Polishing). As a result, a first conductive contact layer (plug) 90 of the polycrystalline silicon layer 80 is formed in the first contact hole 70.

Figure 1E:
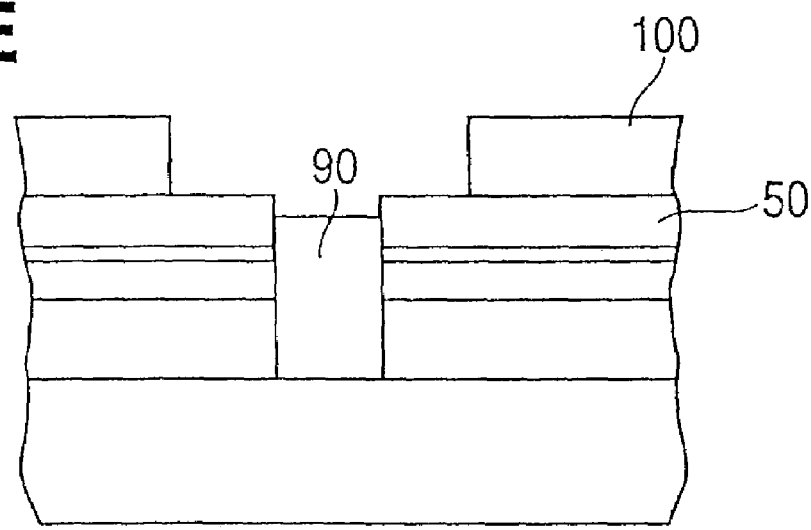

As shown in FIG. 1E, a second resist pattern 100 has an opening so as to expose a top surface of the plug 90. A diameter of the opening is larger than that of the plug 90. The second resist pattern 100 is overlaid the silicon nitride layer 50.

Figure 1F:
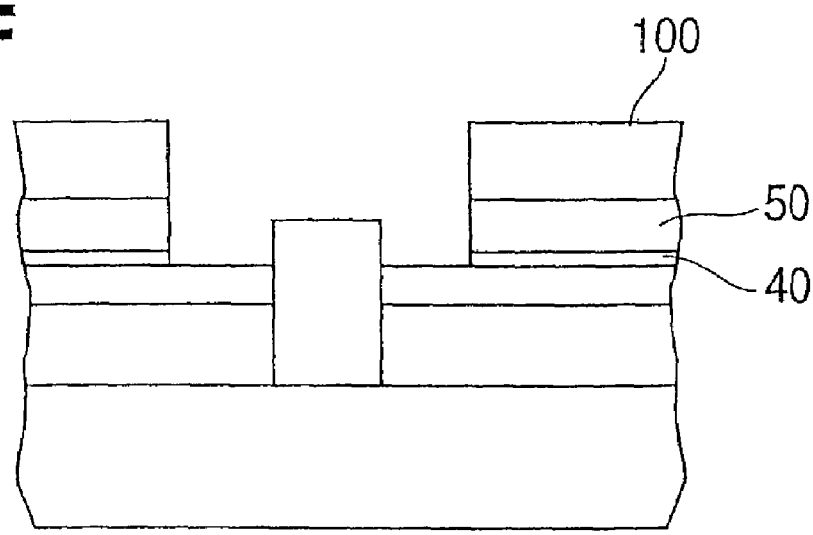

As shown in FIG. 1F, the silicon nitride layer 50 is etched using the second resist pattern 100 as an etching mask. In this time, since the diameter of the opening is larger than that of the plug 90, a tip of the plug 90 protrudes.

Figure 1G:
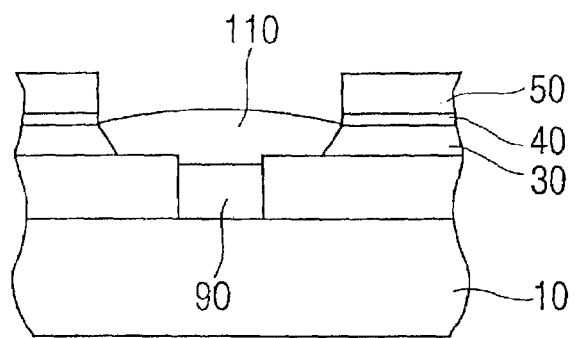

As shown in FIG. 1G, the annealing process is performed. As a result, the tip of the plug 90 and a portion of the silicon layer 30 around the tip of the plug 90 exchanged from silicon and polycrystalline silicon to an oxide. Thus, a field oxide film 110 is formed. Another field oxide films are also formed in each of portions which is formed isolating portion between active region (transistor region) in the silicon layer 30 (not shown). The top surface of the field oxide film 110 can be a low height level because a field oxidation process is performed to the tip of the plug 90. Accordingly, the field oxidation process may be improved the planation for interlayer insulating layers.

Figure 1H:
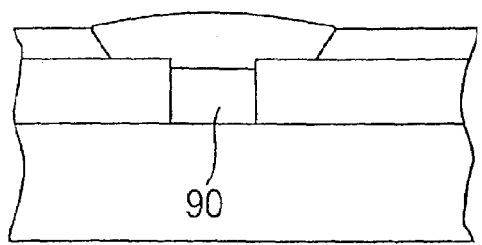

As shown in FIG. 1H, the silicon nitride layer 50 and the silicon oxide film 40 are removed.

Figure 1I:
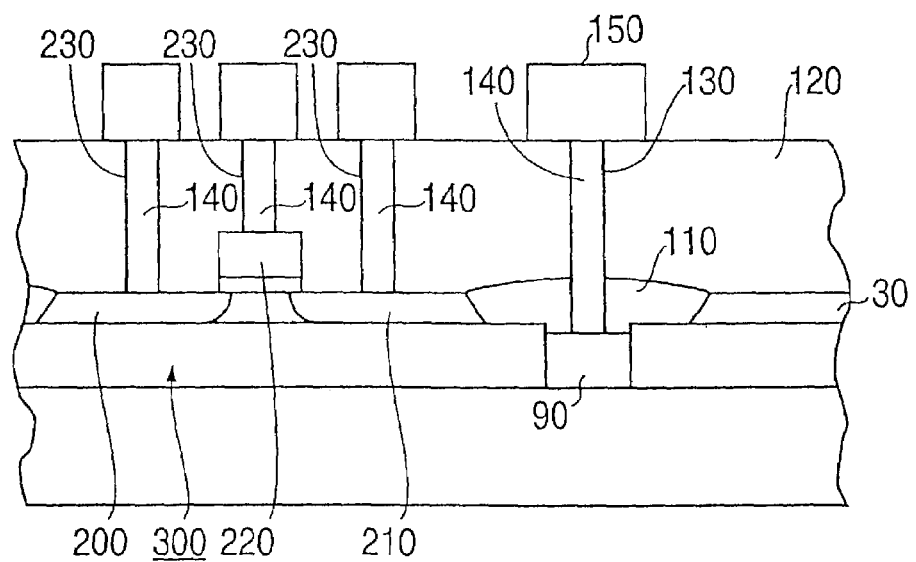

As shown in FIG. 1I, a field effect transistor (FET) 300 having a source 200, a drain 210, and a gate 220 are formed in the active region of the silicon layer 30. Then, an interlayer insulating layer 120 is overlaid an entire structure including the field oxide film 110 and the silicon layer 30 using CVD process. Here, the interlayer insulating layer 120 is a P-TEOS (Plasma-Tetraethoxysilane), a BPSG (Boro-Phospho-Silicate Glass), or an NSG (Non-doped Silicate Glass). Then, a second contact hole 130 is formed so as to pass through the interlayer insulating layer 120 and the field oxide film 110 and to expose a surface of the plug 90. The second contact hole 130 is formed so as to correspond to the first contact hole 70. Third contact holes 230 are formed so as to expose a source 200, a drain 210, and a gate 220 in the silicon layer 30, simultaneously with the second contact hole 130. The simultaneously forming process can be performed because the second and third contact holes 130 and 230 have the substantially same depth. Then, a conductive layer is overlaid the interlayer insulating layer 120 so as to fill with the second and third contact holes 130 and 230. Then, the conductive layer is polished till a surface of the interlayer insulating layer 120 exposes using CMP. As a result, second conductive contact layers 140 are simultaneously formed in the second and third contact holes 130 and 230. Here, the conductive layer is a tungsten (W). Then, an interconnection 150 is electrically connected to the respective second conductive contact layers 140.

As mentioned above, in the first preferred embodiment, the substrate-biasing between the SOI transistor and the silicon substrate 10 is performed via the plug 90. As a result, the contact hole for the substrate-biasing does not need to pass through the insulating layer 20; the silicon layer 30, and the interlayer insulating layer 120. Therefore, the interlayer insulating layer 120 can be the shallow depth. Accordingly, the first preferred embodiment can be enough to be implanted ions to the surface of the substrate via the contact hole for substrate-biasing. It can form the contact hole for substrate-biasing without the contact hole for substrate-biasing causes an opening fault. It can be avoided the problem that the FET is electrically connect to the conductive contact layer in the contact hole because the plug is formed so as to be isolated from the active region of the silicon layer.

In the first preferred embodiment, a shallow trench isolation layer may be used instead of the field oxide film. The third contact hole 230 may be formed for only the source and the drain, or it may be formed for only one of the source and the drain.

A method to improve a law resistance between the plug 90 and the silicon substrate 10 is the following.

For using a silicide layer to decrease a resistance between the plug 90 and the silicon substrate 10, a high melting point metal is formed so as to fill with the first contact hole 70 and overlie the silicon nitride layer 50, after removing the resist pattern 60 as shown in FIG. 1B. However, the silicide layer is also formed on the silicon layer 30 exposed in the first contact hole 70.

In a modification for the first preferred embodiment, the high melting point metal is formed so as to fill with the first contact hole 70 and overlie the silicon nitride layer 50. After that, the plug 90 is formed before performing the annealing process. Then, the high melting point metal on the silicon layer 30 exposed in the first contact hole 70, which is removed without removing the high melting point metal between the plug 90 and the silicon substrate 10. For example, the etching process is performed using RIE. As a result, the silicide layer is not formed on the silicon layer 30, and it can definitely formed between the plug 90 and the silicon substrate 10.

FIG. 2A–FIG. 2I are cross-sectional views showing a method for forming a silicon-on-insulator FET according to a second preferred embodiment of a present invention.

Figure 2A:
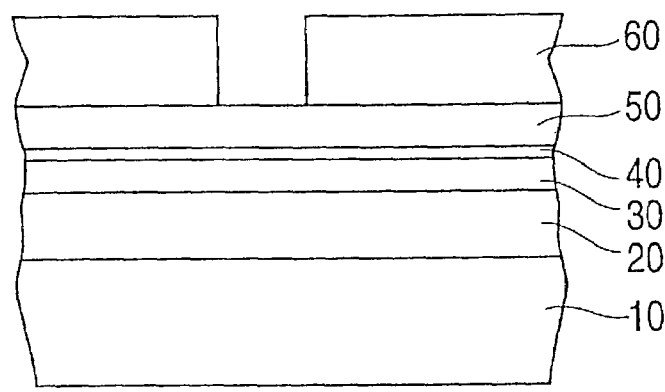
FIG. 2A–FIG. 2I are cross-sectional views showing a method for forming a silicon-on-insulator FET according to a second preferred embodiment of a present invention.

As shown in FIG. 2A, a silicon-on-insulator (SOI) structure is provided. Examples of the methods to form the SOI structure are called SIMOX or a bonded wafer. The SOI structure is made up of a silicon substrate 10, an insulating layer 20, and a silicon layer 30. Then, a silicon oxide film 40 and a silicon nitride layer 50 are sequentially formed on the silicon layer 30. Then, a first resist pattern 60 is overlaid the silicon nitride layer 50. The first resist pattern 60 has an opening corresponded to a portion which is formed a contact hole for a substrate-biasing. The first resist pattern 60 has another openings corresponded to each of portions which is formed isolating portion between active region (transistor region) in the silicon layer 30 (not shown).

Figure 2B:
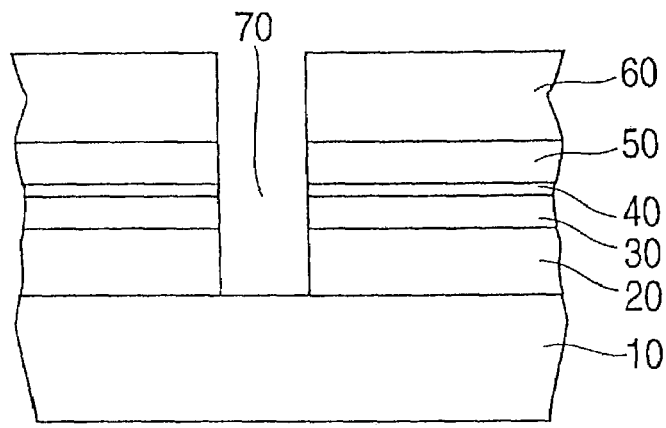

As shown in FIG. 2B, the silicon nitride layer 50, the silicon oxide film 40, the silicon layer 30, and the insulating layer 20 are etched using the first resist pattern 60 as an etching mask. As a result, a first contact hole 70 for a substrate-biasing is formed so as to pass through the silicon nitride layer 50, the silicon oxide film 40, the silicon layer 30, and the insulating layer 20. Then, the first resist pattern 60 is removed.

Figure 2C:
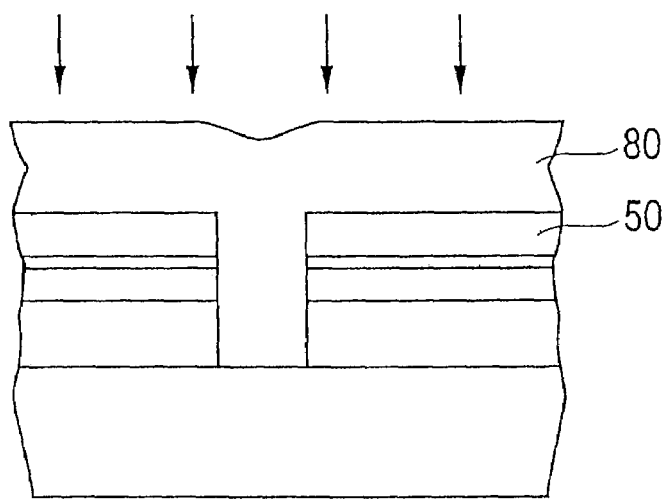

As shown in FIG. 2C, a polycrystalline silicon layer 80 is formed so as to fill with the first contact hole 70 and overlie the silicon nitride layer 50. The polycrystalline silicon layer 80 is obtained a low-resistance of the contact by implanting ions. The ions are also diffused in a portion of the silicon substrate for the substrate-biasing by annealing. Therefore, a diffused region in the silicon substrate 10 formed by processes of the ion-implantation and the annealing, which can decrease the contact resistance for the substrate-biasing.

The diffused region may be formed by implanting ions in the first contact hole 70 and by annealing.

Figure 2D:
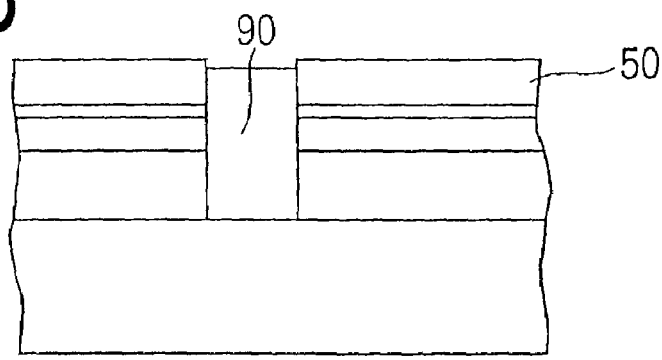

As shown in FIG. 2D, the polycrystalline silicon layer 80 is polished till a surface of the silicon nitride layer 50 exposes using CMP. As a result, a first conductive contact layer (plug) 90 of the polycrystalline silicon layer 80 is formed in the first contact hole 70.

Figure 2E:
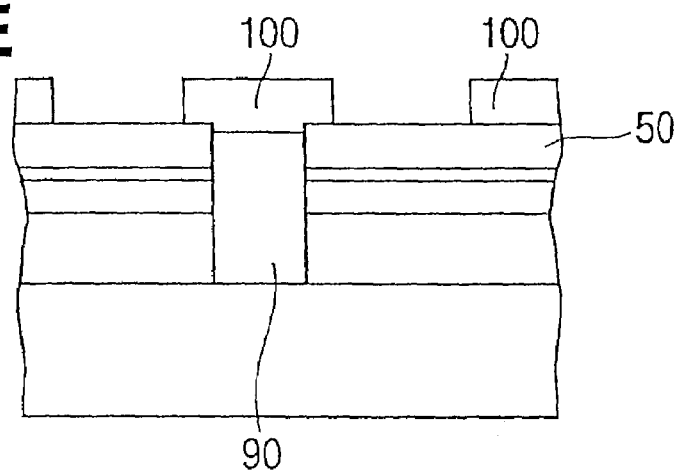

As shown in FIG. 2E, a second resist pattern 100 has an opening so as to expose a top surface of the silicon nitride layer 50 around a top of the plug 90. Here, the second resist pattern 100 is overlaid the top of the plug 90.

Figure 2F:
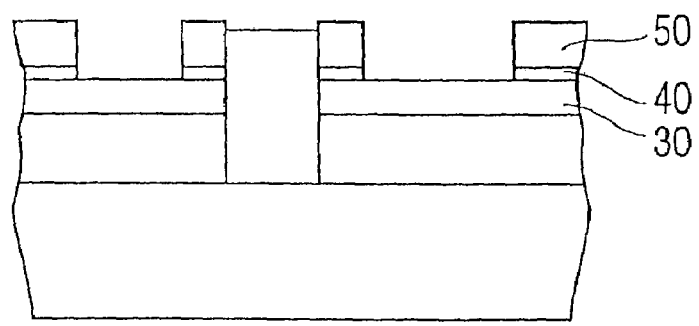

As shown in FIG. 2F, the silicon oxide film 40 and the silicon nitride layer 50 are etched using the second resist pattern 100 as an etching mask. As a result, the silicon layer 30 spaced from the plug 90 is exposed. Then, the second resist pattern 100 is removed.

Figure 2G:
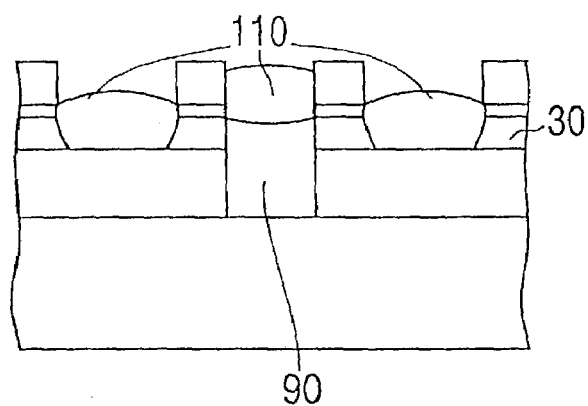

As shown in FIG. 2G, the annealing process is performed. As a result, the tip of the plug 90 and a portion of the silicon layer 30 around the tip of the plug 90 exchanged from silicon and polycrystalline silicon to an oxide. Thus, a field oxide film 110 is formed on each portions of the tip of the plug 90 and the portion of the silicon layer 30 around the tip of the plug 90. The field oxide film 110 on the portion of the silicon layer 30 serves as an isolation region in the silicon layer 30. The field oxide film 110 on the portion of the silicon layer 30 defines an active region (transistor region) in the silicon layer 30. The top surface of the field oxide film 110 on the plug 90 can be a low height level because a field oxidation process is performed to the tip of the plug 90. Accordingly, the field oxidation process may be improved the planation for interlayer insulating layers.

Figure 2H:
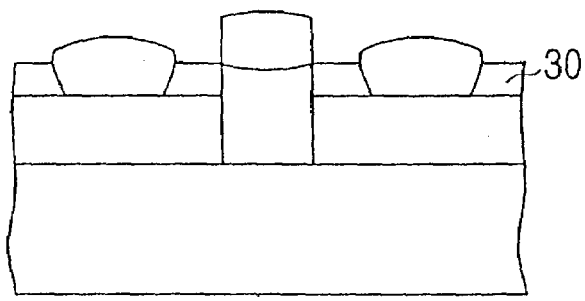

As shown in FIG. 2H, the silicon nitride layer 50 and the silicon oxide film 40 are removed.

Figure 2I:
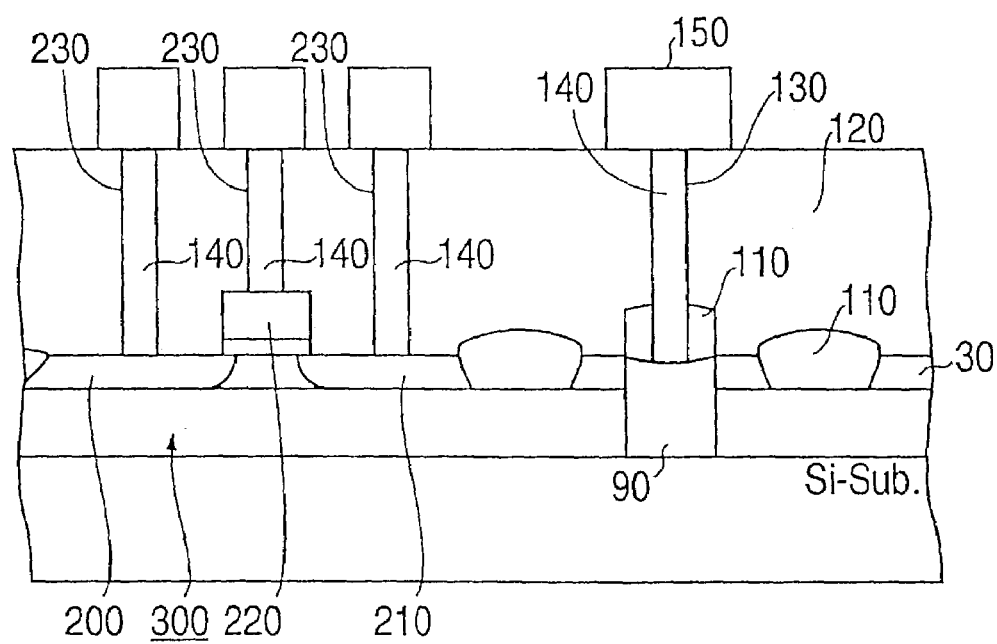

As shown in FIG. 2I, a FET 300 having a source 200, a drain 210, and a gate 220 are formed in the active region of the silicon layer 30. Then, an interlayer insulating layer 120 is overlaid an entire structure including the field oxide film 110 and the silicon layer 30 using CVD process. Here, the interlayer insulating layer 120 is a P-TEOS, a BPSG, or an NSG. Then, a second contact hole 130 is formed so as to pass through the interlayer insulating layer 120 and the field oxide film 110 and to expose a surface of the plug 90. The second contact hole 130 is formed so as to correspond to the first contact hole 70. Third contact holes 230 are formed so as to expose a source 200, a drain 210, and a gate 220 in the silicon layer 30, simultaneously with the second contact hole 130. The simultaneously forming process can be performed because the second and third contact holes 130 and 230 have the substantially same depth. Then, a conductive layer is overlaid the interlayer insulating layer 120 so as to fill with the second and third contact holes 130 and 230. Then, the conductive layer is polished till a surface of the interlayer insulating layer 120 exposes using CMP. As a result, second conductive contact layers 140 are simultaneously formed in the second and third contact holes 130 and 230. Here, the conductive layer is a tungusten (W). Then, an interconnection 150 is electrically connected to the respective second conductive contact layers 140.

As mentioned above, in the second preferred embodiment, the substrate-biasing between the SOI transistor and the silicon substrate 10 is performed via the plug 90. As a result, the contact hole for the substrate-biasing does not need to pass through the insulating layer 20, the silicon layer 30, and the interlayer insulating layer 120. Therefore, the interlayer insulating layer 120 can be the shallow depth. Accordingly, the second preferred embodiment can be enough to be implanted ions to the surface of the substrate via the contact hole for substrate-biasing. It can form the contact hole for substrate-biasing without the contact hole for substrate-biasing causes an opening fault. It can be avoided the problem that the FET is electrically connect to the conductive contact layer in the contact hole because the plug is formed so as to be isolated from the active region of the silicon layer.

Further, in the second preferred embodiment, the field oxide film is formed so as to surround the periphery of the plug. As a result, it could be definitely avoided the problem that the conductive contact layer is electrically connected to the transistor region in the silicon layer.

In the second preferred embodiment, a shallow trench isolation layer may be used instead of the field oxide film. The third contact hole may be formed for only the source and the drain, or it may be formed for only one of the source and the drain.

FIG. 3A–FIG. 3I are cross-sectional views showing a method for forming a silicon-on-insulator FET according to a third preferred embodiment of a present invention.

Figure 3A:
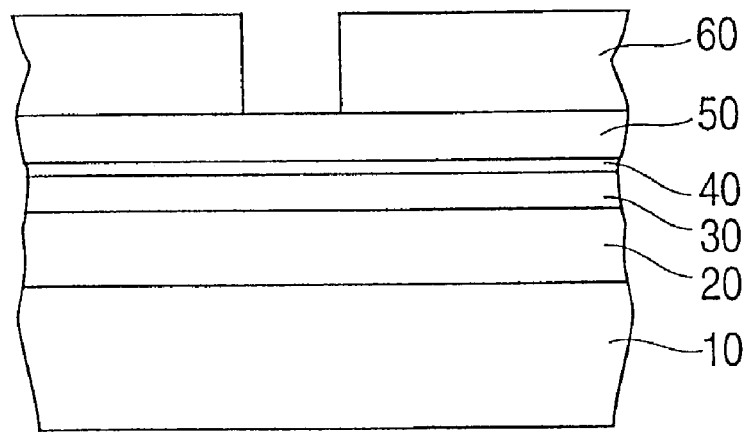
FIG. 3A–FIG. 3I are cross-sectional views showing a method for forming a silicon-on-insulator FET according to a third preferred embodiment of a present invention.

As shown in FIG. 3A, a silicon-on-insulator (SOI) structure is provided. Examples of the methods to form the SOI structure are called SIMOX or a bonded wafer. The SOI structure is made up of a silicon substrate 10, an insulating layer 20, and a silicon layer 30. Then, a silicon oxide film 40 and a silicon nitride layer 50 are sequentially formed on the silicon layer 30. Then, a first resist pattern 60 is overlaid the silicon nitride layer 50. The first resist pattern 60 has an opening corresponded to a portion which is formed a contact hole for a substrate-biasing. The first resist pattern 60 has another openings corresponded to each of portions which is formed isolating portion between active region (transistor region) in the silicon layer 30 (not shown).

Figure 3B:
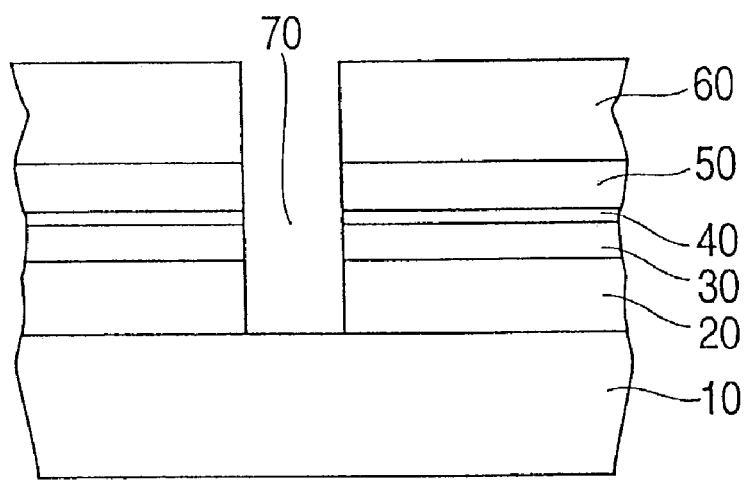

As shown in FIG. 3B, the silicon nitride layer 50, the silicon oxide film 40, the silicon layer 30, and the insulating layer 20 are etched using the first resist pattern 60 as an etching mask. As a result, a first contact hole 70 for a substrate-biasing is formed so as to pass through the silicon nitride layer 50, the silicon oxide film 40, the silicon layer 30, and the insulating layer 20. Then, the first resist pattern 60 is removed.

Figure 3C:
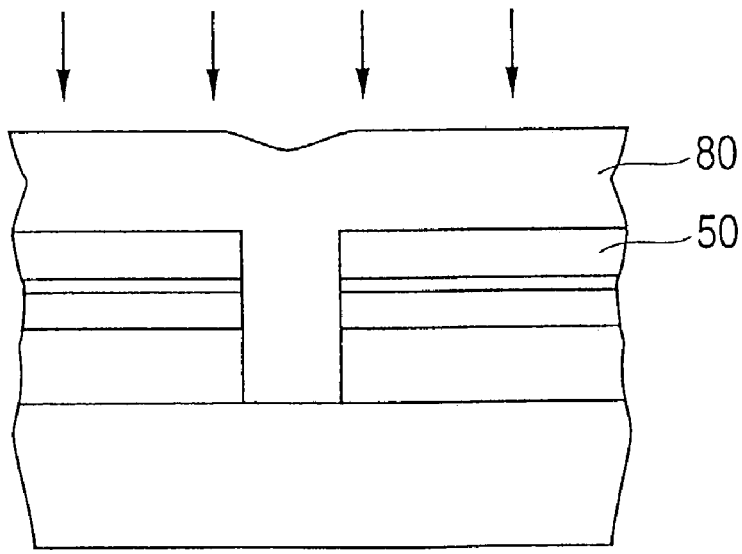

As shown in FIG. 3C, a polycrystalline silicon layer 80 is formed so as to fill with the first contact hole 70 and overlie the silicon nitride layer 50. The polycrystalline silicon layer 80 is obtained a low-resistance of the contact by implanting ions. The ions are also diffused in a portion of the silicon substrate for the substrate-biasing by annealing. Therefore, a diffused region in the silicon substrate 10 formed by processes of the ion-implantation and the annealing, which can decrease the contact resistance for the substrate-biasing.

The diffused region may be formed by implanting ions in the first contact hole 70 and by annealing.

Figure 3D:
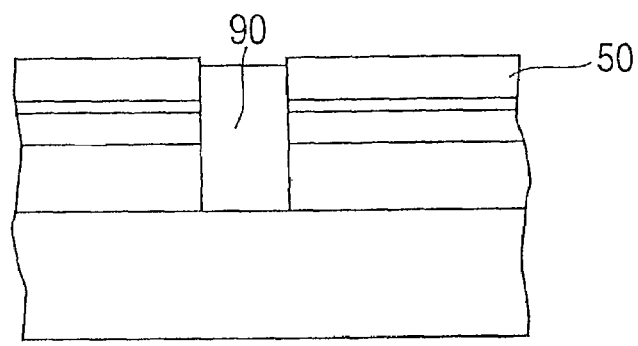

As shown in FIG. 3D, the polycrystalline silicon layer 80 is polished till a surface of the silicon nitride layer 50 exposes using CMP. As a result, a first conductive contact layer (plug) 90 of the polycrystalline silicon layer 80 is formed in the first contact hole 70.

Figure 3E:
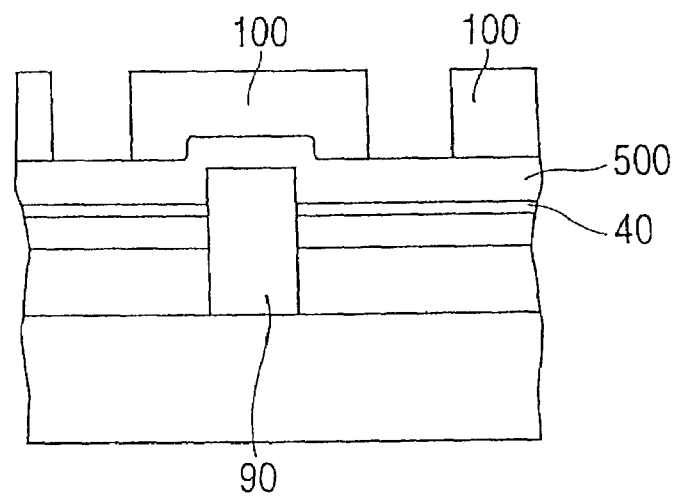

As shown in FIG. 3E, the silicon nitride layer 50 is removed. Then, new silicon nitride layer 500 is formed so as to overlie a top of the plug 90 and the silicon oxide film 40. Then, a second resist pattern 100 has an opening so as to expose a top surface of the silicon nitride layer 50 around an upper portion of the plug 90. Here, the second resist pattern 100 is overlaid the upper portion of the plug 90.

Figure 3F:
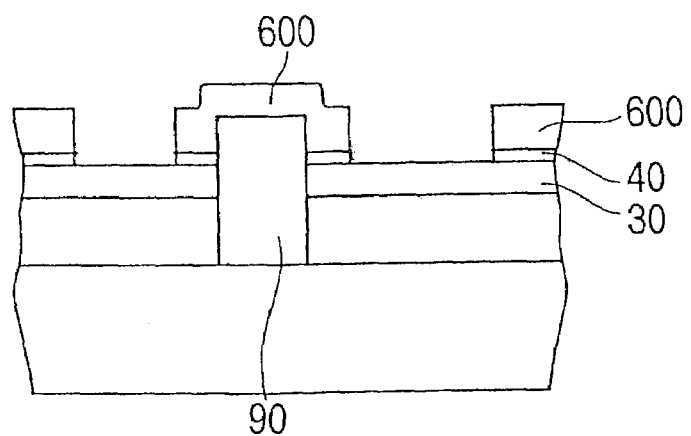

As shown in FIG. 3F, the silicon oxide film 40 and the silicon nitride layer 500 are etched using the second resist pattern 100 as an etching mask. As a result, the silicon layer 30 spaced from the plug 90 is exposed. Then, the second resist pattern 100 is removed. Accordingly, a patterned silicon nitride layer 600 is provided that has an opening so as to expose a top surface of the silicon layer 30 around an upper portion of the plug 90. There, the patterned silicon nitride layer 600 is overlaid the top of the plug 90.

Figure 3G:
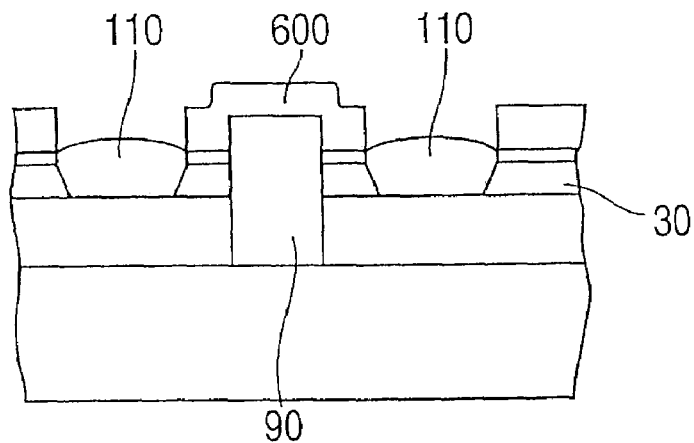

As shown in FIG. 3G, in state of overlying the plug 90 with the patterned silicon nitride layer 600, the annealing process is performed. As a result, only a portion of the silicon layer 30 around the tip of the plug 90 is exchanged from silicon and polycrystalline silicon to an oxide. Thus, a field oxide film 110 is formed on the portion of the silicon layer 30 around the tip of the plug 90. The field oxide film 110 on the portion of the silicon layer 30 serves as an isolation region in the silicon layer 30. The field oxide film 110 on the portion of the silicon layer 30 defines an active region (transistor region) in the silicon layer 30.

Figure 3H:
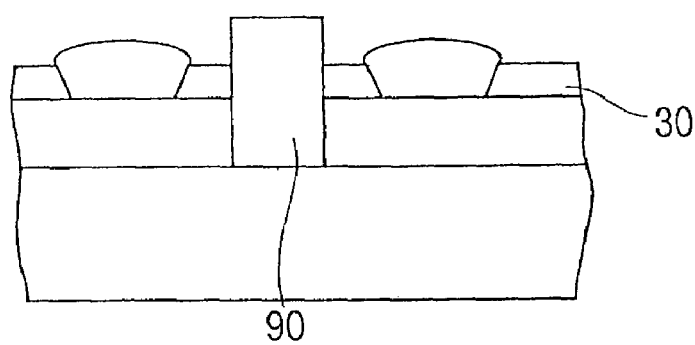

As shown in FIG. 3H, the patterned silicon nitride layer 600 and the silicon oxide film 40 are removed.

Figure 3I:
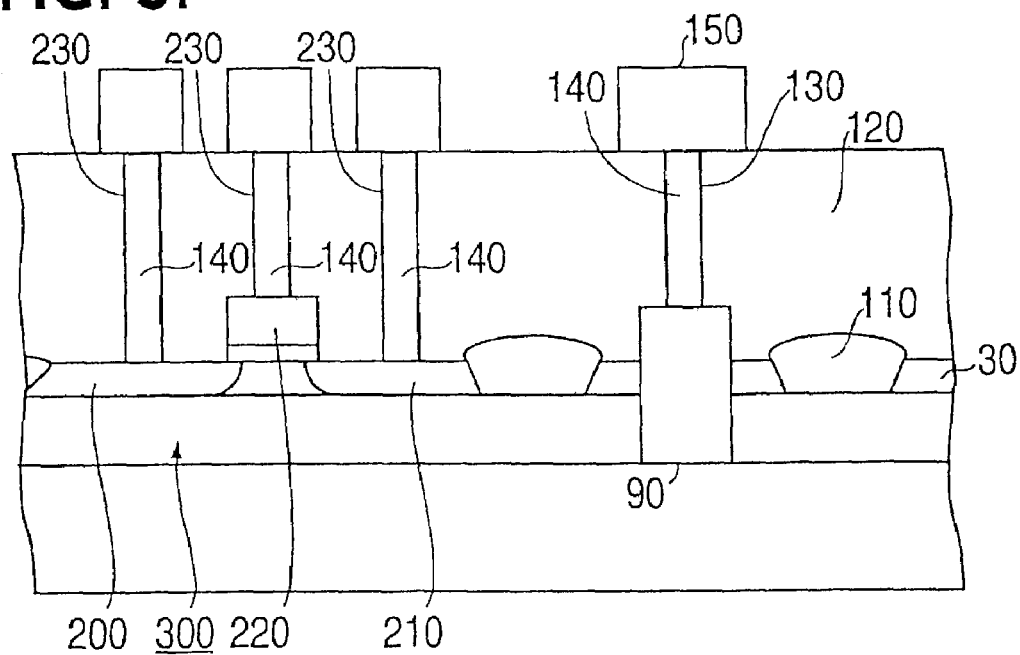

As shown in FIG. 3I, a FET 300 having a source 200, a drain 210, and a gate 220 are formed in the active region of the silicon layer 30. Then, an interlayer insulating layer 120 is overlaid an entire structure including the field oxide film 110 and the silicon layer 30 using CVD process. Here, the interlayer insulating layer 120 is a P-TEOS, a BPSG, or an NSG. Then, a second contact hole 130 is formed so as to pass through the interlayer insulating layer 120 and the field oxide film 110 and to expose a surface of the plug 90. The second contact hole 130 is formed so as to correspond to the first contact hole 70. Third contact holes 230 are formed so as to expose a source 200, a drain 210, and a gate 220 in the silicon layer 30, simultaneously with the second contact hole 130. The simultaneously forming process can be performed because the second and third contact holes 130 and 230 have the substantially same depth. Then, a conductive layer is overlaid the interlayer insulating layer 120 so as to fill with the second and third contact holes 130 and 230. Then, the conductive layer is polished till a surface of the interlayer insulating layer 120 exposes using CMP. As a result, second conductive contact layers 140 are simultaneously formed in the second and third contact holes 130 and 230. Here, the conductive layer is a tungusten (W). Then, an interconnection 150 is electrically connected to the respective second conductive contact layers 140.

As mentioned above, in the third preferred embodiment, the substrate-biasing between the SOI transistor and the silicon substrate 10 is performed via the plug 90. As a result, the contact hole for the substrate-biasing does not need to pass through the insulating layer 20, the silicon layer 30, and the interlayer insulating layer 120. Therefore, the interlayer insulating layer 120 can be the shallow depth. Accordingly, the third preferred embodiment can be enough to be implanted ions to the surface of the substrate via the contact hole for substrate-biasing. It can form the contact hole for substrate-biasing without the contact hole for substrate-biasing causes an opening fault. It can be avoided the problem that the FET is electrically connect to the conductive contact layer in the contact hole because the plug is formed so as to be isolated from the active region of the silicon layer.

Further, in the third preferred embodiment, the field oxide film is formed so as to surround the periphery of the plug. As a result, it could be definitely avoided the problem that the conductive contact layer is electrically connected to the transistor region in the silicon layer.

Further, the third preferred embodiment could be formed so as to protrude a tip of the plug 90. Therefore, a thickness of the plug is thicker than the first and second preferred embodiments. Accordingly, since the contact hole could be shallower than the first and second preferred embodiments, It can form the contact hole for substrate-biasing without the contact hole causes an opening fault.

In the third preferred embodiment, a shallow trench isolation layer may be used instead of the field oxide film. The third contact hole may be formed for only the source and the drain, or it may be formed for only one of the source and the drain.

FIG. 4A–FIG. 4G are cross-sectional views showing a method for forming a silicon-on-insulator FET according to a fourth preferred embodiment of a present invention.

Figure 4A:
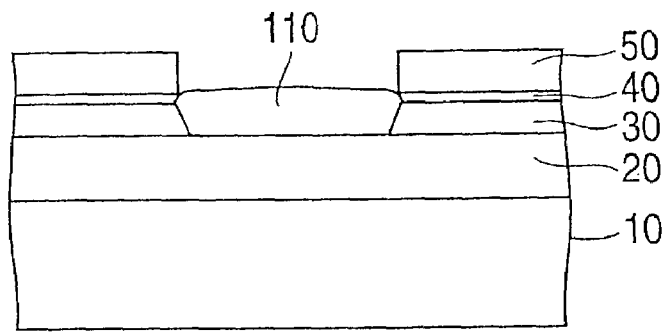
FIG. 4A–FIG. 4G are cross-sectional views showing a method for forming a silicon-on-insulator FET according to a fourth preferred embodiment of a present invention.

As shown in FIG. 4A, a silicon-on-insulator (SOI) structure is provided. Examples of the methods to form the SOI structure are called SIMOX or a bonded wafer. The SOI structure is made up of a silicon substrate 10, an insulating layer 20, and a silicon layer 30. Then, a silicon oxide film 40 and a silicon nitride layer 50 are sequentially formed on the silicon layer 30. Then, a first resist pattern (not shown) is overlaid the silicon nitride layer 50. The first resist pattern has an opening corresponded to an isolation region in the silicon layer 30. Then, the annealing process is performed. As a result, a portion of the silicon layer 30 of the isolation region exchanged from silicon and polycrystalline silicon to an oxide. Thus, a field oxide film 110 is formed in the isolation region in the silicon layer 30. The field oxide film 110 defines a transistor region in the silicon layer 30.

Figure 4B:
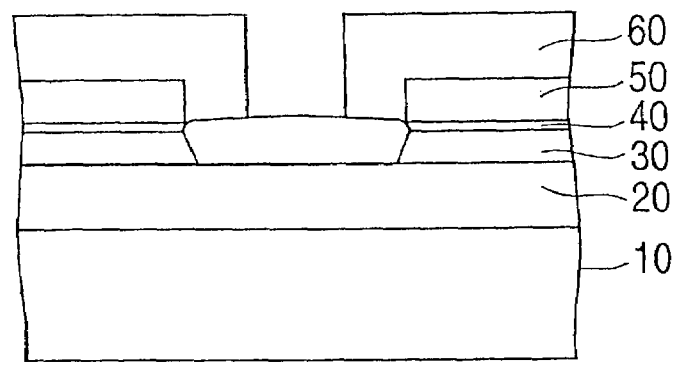

As shown in FIG. 4B, a second resist pattern 60 is overlaid the silicon nitride layer 50. The second resist pattern 60 has an opening so as to expose an upper portion of the field oxide film 110 in a region which is formed a contact hole for a substrate-biasing.

Figure 4C:
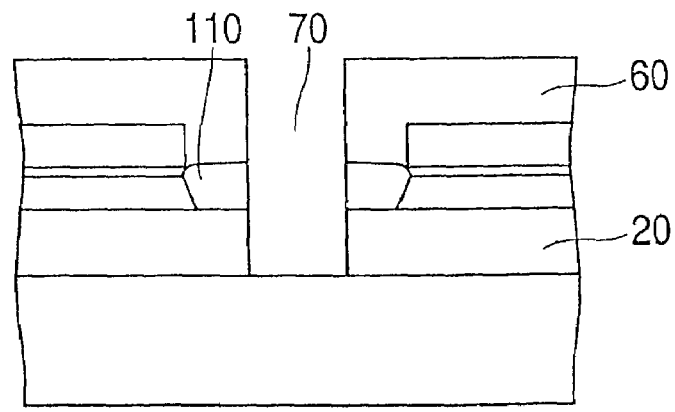

As shown in FIG. 4C, the field oxide film 110 and the silicon layer 30 are etched using the second resist pattern 60 as an etching mask. As a result, a first contact hole 70 is formed so as to pass through the field oxide film 110 and the silicon layer 30.

Figure 4D:
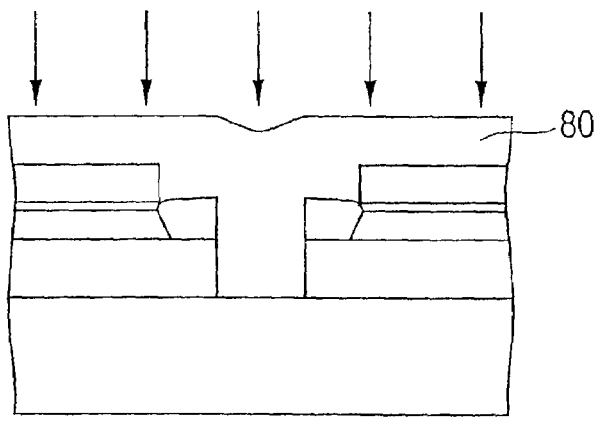

As shown in FIG. 4D, a polycrystalline silicon layer 80 is formed so as to fill with the first contact hole 70 and overlie the silicon nitride layer 50. The polycrystalline silicon layer 80 is obtained a low-resistance of the contact by implanting ions. The ions are also diffused in a portion of the silicon substrate for the substrate-biasing by annealing. Therefore, a diffused region in the silicon substrate 10 formed by processes of the ion-implantation and the annealing, which can decrease the contact resistance for the substrate-biasing.

The diffused region may be formed by implanting ions in the first contact hole 70 and by annealing.

Figure 4E:
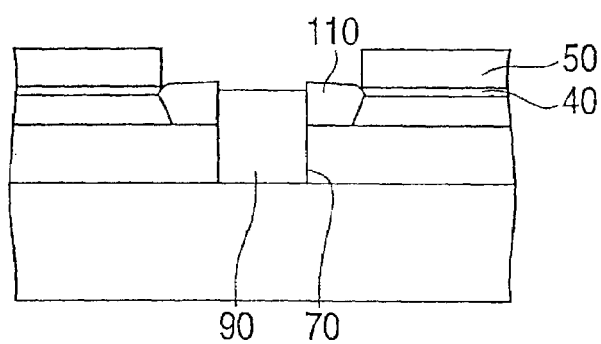
Figure 4F:
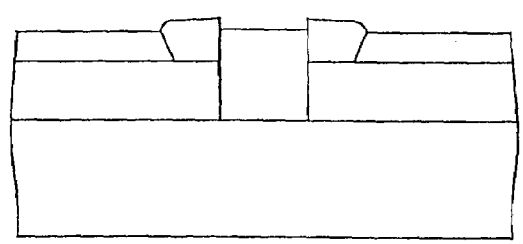

As shown in FIG. 4E, the polycrystalline silicon layer 80 is polished till a surface of the silicon nitride layer 50 and the field oxide film 110 exposes using CMP. As a result, a first conductive contact layer (plug) 90 of the polycrystalline silicon layer 80 is formed in the first contact hole 70. As shown in FIG. 4F, the silicon nitride layer 50 and the silicon oxide film 40 are removed.

Figure 4G:
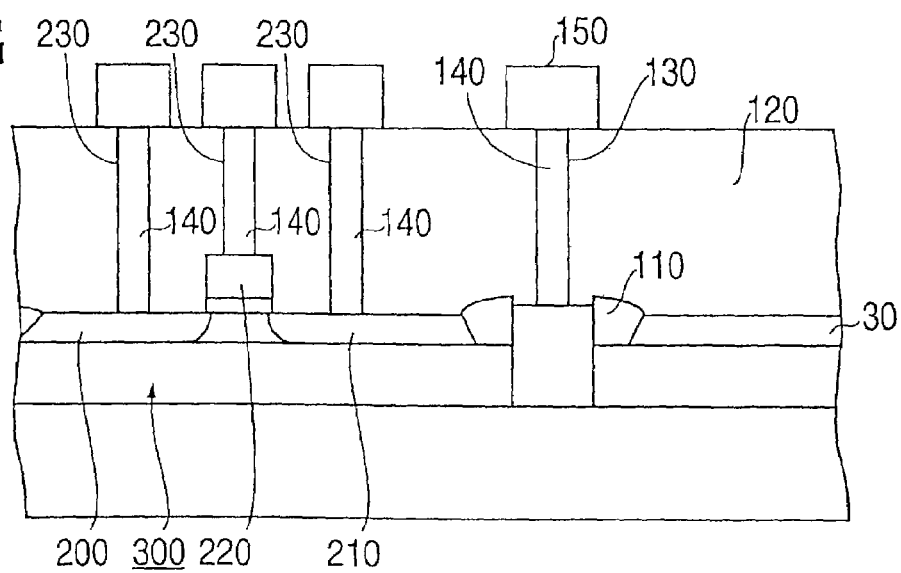

As shown in FIG. 4G, a FET 300 having a source 200, a drain 210, and a gate 220 are formed in the active region of the silicon layer 30. Then, an interlayer insulating layer 120 is overlaid an entire structure including the field oxide film 110 and the silicon layer 30 using CVD process. Here, the interlayer insulating layer 120 is a P-TEOS, a BPSG, or an NSG. Then, a second contact hole 130 is formed so as to pass through the interlayer insulating layer 120 and the field oxide film 110 and to expose a surface of the plug 90. The second contact hole 130 is formed so as to correspond to the first contact hole 70. Third contact holes 230 are formed so as to expose a source 200, a drain 210, and a gate 220 in the silicon layer 30, simultaneously with the second contact hole 130. The simultaneously forming process can be performed because the second and third contact holes 130 and 230 have the substantially same depth. Then, a conductive layer is overlaid the interlayer insulating layer 120 so as to fill with the second and third contact holes 130 and 230. Then, the conductive layer is polished till a surface of the interlayer insulating layer 120 exposes using CMP. As a result, second conductive contact layers 140 are simultaneously formed in the second and third contact holes 130 and 230. Here, the conductive layer is a tungusten (W). Then, an interconnection 150 is electrically connected to the respective second conductive contact layers 140.

As mentioned above, in the fourth preferred embodiment, the substrate-biasing between the SOI transistor and the silicon substrate 10 is performed via the plug 90. As a result, the contact hole for the substrate-biasing does not need to pass through the insulating layer 20, the silicon layer 30, and the interlayer insulating layer 120. Therefore, the interlayer insulating layer 120 can be the shallow depth. Accordingly, the fourth preferred embodiment can be enough to be implanted ions to the surface of the substrate via the contact hole for substrate-biasing. It can form the contact hole for substrate-biasing without the contact hole for substrate-biasing causes an opening fault. It can be avoided the problem that the FET is electrically connect to the conductive contact layer in the contact hole because the plug is formed so as to be isolated from the active region of the silicon layer.

Further, in the fourth preferred embodiment, first of all, field oxide films as defining the transistor region are formed in the silicon layer of the SOI structure. Then, the plug for the substrate-biasing is formed. Therefore, the fourth preferred embodiment does not need the field oxide film for the substrate-biasing. Accordingly, it could be avoided the problem of increasing the chip size.

Further, in the fourth preferred embodiment, the field oxide film is formed so as to surround the periphery of the plug. As a result, it could be definitely avoided the problem that the conductive contact layer is electrically connected to the transistor region in the silicon layer.

In the fourth preferred embodiment, a shallow trench isolation layer may be used instead of the field oxide film. The third contact hole may be formed for only the source and the drain, or it may be formed for only one of the source and the drain.

FIG. 5A–FIG. 5G are cross-sectional views showing a method for forming a silicon-on-insulator FET according to a fifth preferred embodiment of a present invention.

Figure 5A:
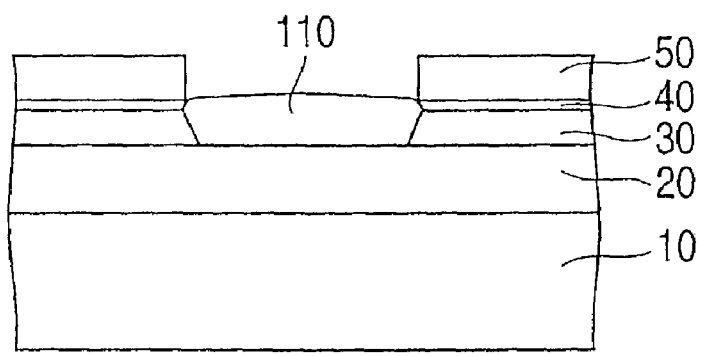
FIG. 5A–FIG. 5G are cross-sectional views showing a method for forming a silicon-on-insulator FET according to a fifth preferred embodiment of a present invention.

As shown in FIG. 5A, a silicon-on-insulator (SOI) structure is provided. Examples of the methods to form the SOI structure are called SIMOX or a bonded wafer. The SOI structure is made up of a silicon substrate 10, an insulating layer 20, and a silicon layer 30. Then, a silicon oxide film 40 and a silicon nitride layer 50 are sequentially formed on the silicon layer 30. Then, a first resist pattern (not shown) is overlaid the silicon nitride layer 50. The first resist pattern has an opening corresponded to an isolation region in the silicon layer 30. Then, the annealing process is performed. As a result, a portion of the silicon layer 30 of the isolation region exchanged from silicon and polycrystalline silicon to an oxide. Thus, a field oxide film 110 is formed in the isolation region in the silicon layer 30. The field oxide film 110 defines a transistor region in the silicon layer 30.

Figure 5B:
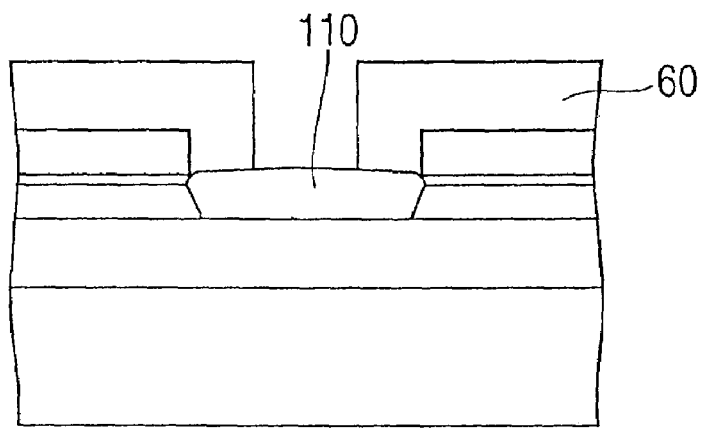

As shown in FIG. 5B, a second resist pattern 60 is overlaid the silicon nitride layer 50. The second resist pattern 60 has an opening so as to expose an upper portion of the field oxide film 110 in a region which is formed a contact hole for a substrate-biasing.

Figure 5C:
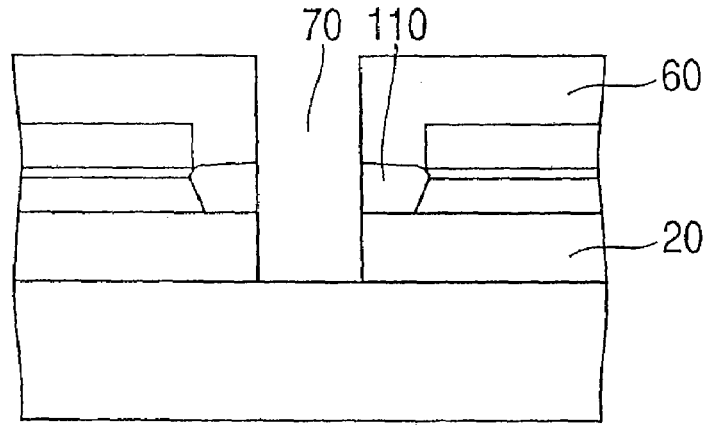

As shown in FIG. 5C, the field oxide film 110 and the silicon layer 30 are etched using the second resist pattern 60 as an etching mask. As a result, a first contact hole 70 is formed so as to pass through the field oxide film 110 and the silicon layer 30.

Figure 5D:
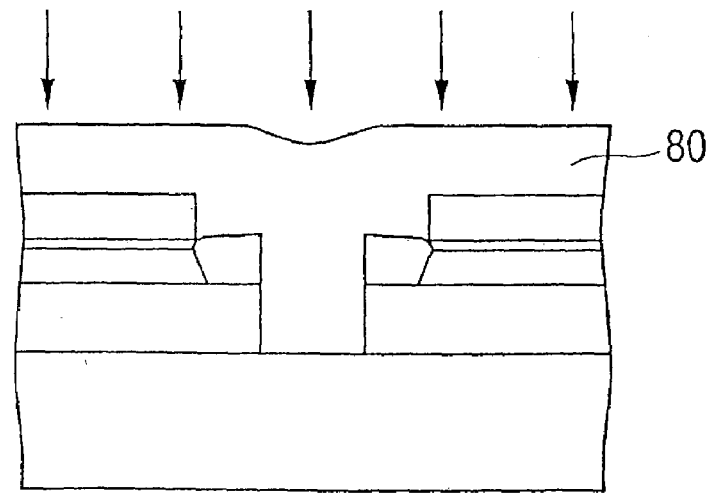

As shown in FIG. 5D, a polycrystalline silicon layer 80 is formed so as to fill with the first contact hole 70 and overlie the silicon nitride layer 50. The polycrystalline silicon layer 80 is obtained a low-resistance of the contact by implanting ions. The ions are also diffused in a portion of the silicon substrate for the substrate-biasing by annealing. Therefore, a diffused region in the silicon substrate 10 formed by processes of the ion-implantation and the annealing, which can decrease the contact resistance for the substrate-biasing.

The diffused region may be formed by implanting ions in the first contact hole 70 and by annealing.

Figure 5E:
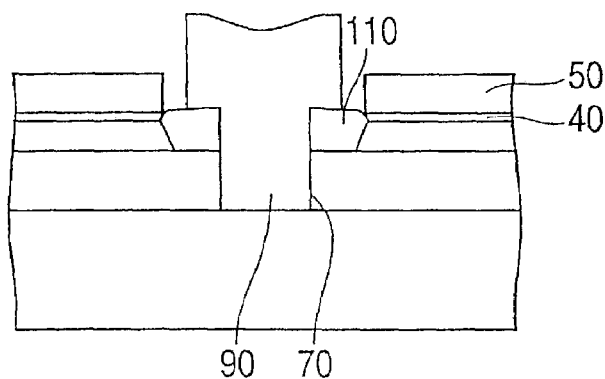

As shown in FIG. 5E, a third resist pattern (not shown) is formed on the polycrystalline silicon layer 80. The third resist pattern has an opening so as to expose a periphery region of the field oxide film 110. The third resist pattern is overlaid a plug forming portion. Then, the polycrystalline silicon layer 80 is etched using the third resist pattern as an etching mask. As a result, a plug 90 is formed in the first contact hole 70.

Figure 5F:
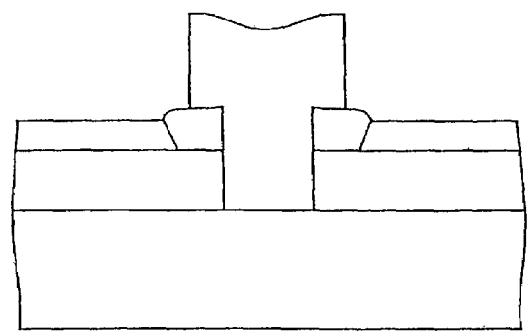

As shown in FIG. 5F, the third resist pattern, the silicon nitride layer 50 and the silicon oxide film 40 are removed.

Figure 5G:
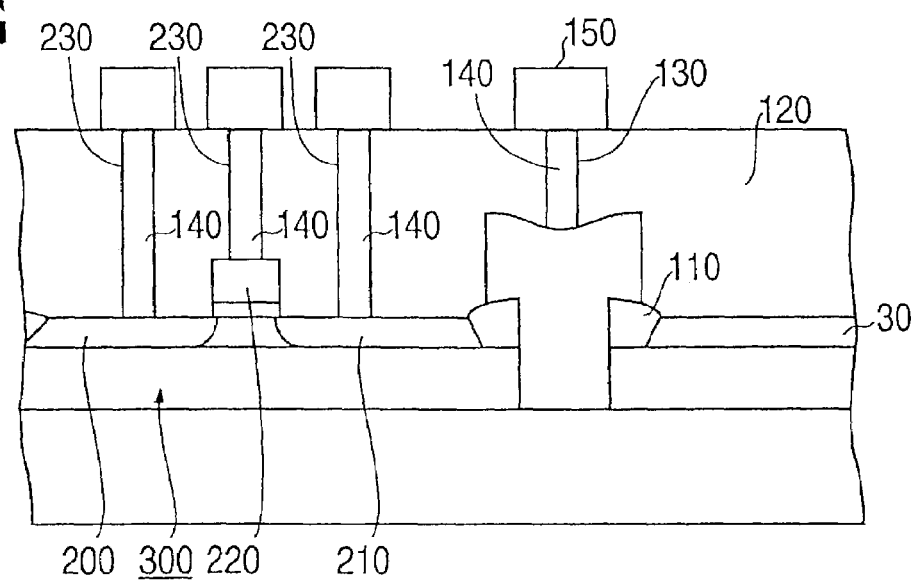

As shown in FIG. 5G, a FET 300 having a source 200, a drain 210, and a gate 220 are formed in the active region of the silicon layer 30. Then, an interlayer insulating layer 120 is overlaid an entire structure including the field oxide film 110 and the silicon layer 30 using CVD process. Here, the interlayer insulating layer 120 is a P-TEOS, a BPSG, or an NSG. Then, a second contact hole 130 is formed so as to pass through the interlayer insulating layer 120 and the field oxide film 110 and to expose a surface of the plug 90. The second contact hole 130 is formed so as to correspond to the first contact hole 70. Third contact holes 230 are formed so as to expose a source 200, a drain 210, and a gate 220 in the silicon layer 30, simultaneously with the second contact hole 130. The simultaneously forming process can be performed because the second and third contact holes 130 and 230 have the substantially same depth. Then, a conductive layer is overlaid the interlayer insulating layer 120 so as to fill with the second and third contact holes 130 and 230. Then, the conductive layer is polished till a surface of the interlayer insulating layer 120 exposes using CMP. As a result, second conductive contact layers 140 are simultaneously formed in the second and third contact holes 130 and 230. Here, the conductive layer is a tungusten (W). Then, an interconnection 150 is electrically connected to the respective second conductive contact layers 140.

As mentioned above, in the fifth preferred embodiment, the substrate-biasing between the SOI transistor and the silicon substrate 10 is performed via the plug 90. As a result, the contact hole for the substrate-biasing does not need to pass through the insulating layer 20, the silicon layer 30, and the interlayer insulating layer 120. Therefore, the interlayer insulating layer 120 can be the shallow depth. Accordingly, the fifth preferred embodiment can be enough to be implanted ions to the surface of the substrate via the contact hole for substrate-biasing. It can form the contact hole for substrate-biasing without the contact hole for substrate-biasing causes an opening fault. It can be avoided the problem that the FET is electrically connect to the conductive contact layer in the contact hole because the plug is formed so as to be isolated from the active region of the silicon layer.

Further, in the fifth preferred embodiment, first of all, field oxide films as defining the transistor region are formed in the silicon layer of the SOI structure. Then, the plug for the substrate-biasing is formed. Therefore, the fourth preferred embodiment does not need the field oxide film for the substrate-biasing. Accordingly, it could be avoided the problem of increasing the chip size.

Further, in the fifth preferred embodiment, the field oxide film is formed so as to surround the periphery of the plug. As a result, it could be definitely avoided the problem that the conductive contact layer is electrically connected to the transistor region in the silicon layer.

In the fifth preferred embodiment, a shallow trench isolation layer may be used instead of the field oxide film. The third contact hole may be formed for only the source and the drain, or it may be formed for only one of the source and the drain.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method for forming a silicon-on-insulator FET having a contact that provides a fixed potential to a substrate, the method comprising:

providing an insulating layer on the substrate;

forming a silicon layer on the insulating layer;

forming a first through-hole that passes through the silicon layer and the insulating layer;

filling the first through-hole with a first conductive contact layer, the first conductive contact layer being electrically connected to the substrate;

forming an isolating layer in the silicon layer and surrounding the first conductive contact layer, the isolating layer being spaced apart from the first conductive contact layer with the silicon layer therebetween;

forming a transistor in the silicon layer after said filling the first through-hole;

forming an interlayer-insulating layer overlying the silicon layer, the first conductive contact layer, and the transistor;

forming a second through-hole in the interlayer-insulating layer to expose the first conductive contact layer; and filling the second through-hole with a second conductive contact layer.

2. The method for forming a silicon-on-insulator FET as claimed in claim 1, wherein said forming a transistor comprises providing a source, a drain, and a gate in the silicon layer, the method further comprising:

forming third through holes in the interlayer-insulating layer simultaneously with said forming a second through-hole, wherein one of or all of the source, the drain, and the gate are exposed by the third through-holes; and filling the third through holes with a third conductive contact layer simultaneously with said filling the second through-hole.

3. The method for forming a silicon-on-insulator FET as claimed in claim 1, wherein the isolating layer comprises a field oxide film or a shallow trench isolating layer.

4. The method for forming a silicon-on-insulator FET as claimed in claim 1, further comprising implanting ions to the substrate via the first through-hole.

* * * * *